(12) United States Patent
Thomas et al.

(10) Patent No.: US 6,927,484 B2
(45) Date of Patent: Aug. 9, 2005

(54) STACK ARRANGEMENT OF A MEMORY MODULE

(75) Inventors: Jochen Thomas, Munich (DE); Wolfgang Hetzel, Nattheim (DE)

(73) Assignee: Infineon Technologies AG, Munich (DE)

( * ) Notice: Subject to any disclaimer, the term of this patent is extended or adjusted under 35 U.S.C. 154(b) by 36 days.

(21) Appl. No.: 10/700,871

(22) Filed: Nov. 4, 2003

(65) Prior Publication Data

US 2004/0113256 A1 Jun. 17, 2004

(30) Foreign Application Priority Data

Nov. 4, 2002 (DE) .......................................... 102 51 530

(51) Int. Cl.[7] .............................................. H01L 23/02
(52) U.S. Cl. ............... 257/685; 257/686; 257/E25.013; 257/E25.018
(58) Field of Search ................................ 257/685, 686, 257/E25.013, E25.018

(56) References Cited

U.S. PATENT DOCUMENTS

| 5,012,323 | A | | 4/1991 | Farnworth | |
|---|---|---|---|---|---|
| 5,726,492 | A | * | 3/1998 | Suzuki et al. | ............... 257/685 |
| 5,744,827 | A | * | 4/1998 | Jeong et al. | ............... 257/686 |
| 6,495,442 | B1 | | 12/2002 | Lin et al. | |
| 6,841,863 | B2 | * | 1/2005 | Baik et al. | ................. 257/686 |
| 2003/0020151 | A1 | | 1/2003 | Chen et al. | |
| 2003/0153122 | A1 | | 8/2003 | Brooks | |
| 2003/0160312 | A1 | | 8/2003 | Lo et al. | |
| 2003/0203537 | A1 | | 10/2003 | Koopmans | |

FOREIGN PATENT DOCUMENTS

| JP | 8250651 | 9/1996 |
|---|---|---|
| JP | 11135714 | 5/1999 |
| JP | 2002-261233 | 9/2002 |

* cited by examiner

*Primary Examiner*—Jasmine Clark
(74) *Attorney, Agent, or Firm*—Slater & Matsil, L.L.P.

(57) ABSTRACT

A stack arrangement of discrete components includes a carrier substrate and at least two discrete components, e.g., memory chips. The carrier substrate has line conductor structures and contact pads. Each of the discrete components includes centrally disposed bond pads and a metallic coating, which is electrically connected to the centrally disposed bond pads. The metallic coating is disposed on an active surface area of each discrete component. A protective structure overlies a central region of the discrete component. In the preferred embodiment, the metallic coatings of each discrete component are identical. Preferably, the discrete components are stacked on the carrier substrate so as to have the same orientation, so that the protective structure serves as a spacer between the discrete components. Further, the metallic coating is electrically coupled to the carrier substrate.

33 Claims, 2 Drawing Sheets

STACK ARRANGEMENT OF A MEMORY MODULE

CROSS-REFERENCE TO RELATED APPLICATIONS

This application relates to the following co-pending and commonly assigned patent application Ser. No. 10/701,742, filed Nov. 4, 2003 and entitled "Method for Producing a Stack Arrangement of a Memory Module," which application is hereby incorporated herein by reference.

TECHNICAL FIELD

The present invention relates generally to assembly of electronic components, and more particularly to a stack arrangement of a memory module.

BACKGROUND

A well-known embodiment of a stack arrangement provides for stacking two memory chips within an FBGA package. Here, the lower memory chip, with its active surface area face-down, is integrated into the circuit by means of the conventional Board-on-Chip (BoC) technology and the upper memory chip, with its active surface area face-up, is attached to the lower memory chip and integrated by means of wire bond connections.

Since the electrical connections of the upper memory chip on the carrier substrate must be on the same side as those of the lower memory chip, this stack arrangement for memory chips with bond pads in a double-row arrangement, because of the simultaneous face-up and face-down arrangement in one stack, requires that the individual wire bond connections for the upper memory chip be crossed. In addition to prolonging the signal transit times, this design leads to technical problems because of the potential mechanical, electrical or thermal interactions between the wire bond connections at the crossover points. Another serious disadvantage of this stack arrangement is that bum-in and testing are possible only once the stack arrangement has been completely assembled, which leads to a relatively high loss rate which amounts to approximately the square of the loss rate of one discrete component.

Thus, one problem that can be solved by some embodiments of the present invention is to make available a stack arrangement for a memory module that meets the requirements of small dimensions and low electrical parasitism, approximately identical to that of discrete components, makes it possible to achieve especially low signal transit times, reduces the loss rate of the assembled arrangements, and can be integrated into the existing manufacturing and testing technology.

SUMMARY OF THE INVENTION

This and other problems are generally solved or circumvented, and technical advantages are generally achieved, by preferred embodiments of the present invention which provides a stacked arrangement for a memory module.

In particular, the problems discussed above are solved according to embodiments of the present invention by providing that a metallic coating electrically connected to the bond pads of the memory chip is disposed on the active surface area of each memory chip, that the metallic coatings of each discrete component are identical, that the central regions of each memory chip have a protective structure (encapsulation), that the discrete components on the carrier substrates are stacked on top of one another so as to have the same orientation, with the encapsulation serving as a spacer between the memory chips, and that each metallic coating is electrically connected to the carrier substrate.

The metallic coating makes it possible to stack the memory chips with their central single-row, double-row or multi-row bond pads by connecting them via suitable line conductor structures to the edge areas of the discrete component where they can be electrically connected to the carrier substrate. These line conductor structures may be, for example, interposers with conductor paths that are connected to the bond pads of the memory chip by means of wire jumpers. The metallic coating used may, however, also be a tape comprising conductor strands or a deposited, structured and electrically conductive thin film, with the electrical connection to the bond pads being implemented by means of direct connections.

The encapsulation of the central regions of the memory chips is designed so as to form an elevated structure which, on stacking, serves as a spacer between the discrete memory chips and, on face-down stacking, as a spacer between the lowermost memory chip and the carrier substrate. To provide for a mechanical connection, a cover can be applied, such as particularly an adhesive tape or printed materials. Alternatively, the encapsulation may be self-adhesive and, at the same time, function as a mechanical fixation. Since the discrete components have the design described, the stack arrangement is possible both as a face-up and as a face-down stack arrangement. Regardless of the stack arrangement chosen, the signal transit times of the discrete components in the stack arrangement are decisively determined by the height of said components and—since the unpackaged chips can be stacked directly on top of each other because of the encapsulation and since all discrete components in one stack have the same orientation—are equalized so as to make them nearly identical. The uniform orientation as a face-up or a face-down arrangement furthermore avoids the interactions between the wire bond connections associated with the crossover of the wire bond connections.

By protecting the connections of the bond pads of the memory chips, the encapsulation makes possible the burn-in and the testing of the discrete components of the stack arrangement. An additional advantage for testing the discrete components in the course of the technological manufacturing process is the application of identical metallic coatings on all memory chips, regardless of their subsequent location in the stack arrangement. By testing the discrete components prior to stacking, the loss rates of the assembled stacked arrangements can be markedly reduced. This particular advantage of the present invention is especially useful at the time when a new product is being introduced since the loss rate during that time is especially high.

Another advantage of the present invention is the possibility of using standard equipment and standard programs for manufacturing the metallic coatings, the encapsulations and the mechanical connection of the discrete components as well as for testing the discrete components. In particular, the wire bond connections can be encapsulated by applying a multi-component epoxy resin system that is solid at room temperature as a casting material (molding), by applying the casting material by means of screen printing (printing) or by applying the casting material at various spots by means of a metering syringe using compressed air (dispensing). The discrete components can be connected by applying an adhesive coating or a tape to the encapsulation or by designing the encapsulation so as to be self-adhesive and by subsequently gluing the discrete components to each other. For contacting for the purpose of the burn-in and testing, standard procedures, such as contacting the bond pads on the metallic coating by means of needles or balls, can be used. It is also possible to apply sacrificial balls to the metallic coating that can be removed after the testing and the burn-in.

In a preferred embodiment of the present invention, the electrical connection to the carrier substrate, at least of the second discrete component in the stack sequence, is implemented by means of wire jumpers. This makes it possible to stack the discrete components either face-up or face-down. While in face-up stacking the electrical contacts between all of the discrete components and the carrier substrate are made by means of wire jumpers, in face-down stacking, it is possible to provide for direct electrical contacting at least between the lowermost discrete component and the carrier substrate via corresponding soldered contact structures of the metallic coating and the carrier substrate.

Another embodiment of the present invention involves a stack arrangement in which the discrete components are stacked face down on the carrier substrate, in which a reroute layer, which is identical to the metallic coating and which is electrically connected to the upper discrete component via soldered connections and to the carrier substrate via wire jumpers, is disposed between the discrete components, and in which the lower discrete component is directly connected to the contact pads of the carrier substrate via soldered connections.

Although this stack arrangement according to the present invention again provides for connecting the centrally disposed bond pads of the discrete memory chips in their edge region by means of a metallic coating and for stacking the discrete components face down by means of the encapsulation, the electrical contacting of the second and possibly each additional discrete component on the carrier substrate is implemented by means of an additional reroute layer in a plane on the back surface of the discrete component located below. The face-down arrangement of the lowermost discrete component makes it possible to directly contact said component via soldered connections, in particular via solder bumps, and thus, for example, to utilize the advantages of SMT technology or of the flip chip bonding processes, in particular the parallel production of all contacts of the metallic coating. Because of the line conductor configuration of the reroute layer on the back surface of the lower discrete component which has the same contact pad spacing as the carrier substrate, the contacting of the second and each additional discrete component can be implemented in the same way as that of the first component by means of direct contacting via soldered connections. The electrical contacting of the reroute layers, on the other hand, and thus indirectly of the upper and each additional discrete component to the carrier substrate, takes place via wire jumpers. Since each reroute layer is located on the back surface of the discrete component directly below, these wire jumpers are shorter by at least the height of one encapsulation when compared to the stack arrangements of identical discrete components, and by the height of a memory chip with a metallic coating when compared to the face-up stack arrangement, which leads to an additional shortening of the signal transit times and makes this stack arrangement suitable for higher clock frequencies.

Because of the protection of the connections of the bond pads of the memory chip by means of the encapsulation and because of the identical application of the metallic coatings on each memory chip, this stack arrangement according to the present invention again makes it possible to advantageously test the discrete components prior to stacking, on the one hand, and to use standard technologies and standard programs for the manufacture, the burn-in and the testing of the assembled component.

In a useful embodiment according to the present invention, the reroute layer is disposed between the discrete components on the back surface of at least the lower discrete component directly on a dielectric on the back surface of the memory chip and is comprised of a structured metallic coating. This coating structure provides for the lowest possible increase in height obtainable by inserting said additional rewiring plane between the encapsulation of the upper component and the back surface of the lower component that is stacked face down, which contributes significantly to the minimization of the signal transit times. Since the presence of an additional reroute layer, not needed for the vertical contacting of the stack arrangement, on the back surface of the uppermost memory chip does not negatively influence the properties of the stack arrangement, all discrete components of the stack arrangement can be manufactured in the same way, thus obviating the necessity of differentiating the processing steps in the manufacture of the discrete components.

By disposing the reroute layer on an intermediate layer and by placing the lowermost discrete component on the carrier substrate by means of suitable solder bumps which are not shown in the drawing, thus creating a space between the encapsulation of the lowermost discrete component and the carrier substrate, the reliability of the arrangement is increased in other embodiments according to the present invention because of the optimization of the sequence of layers and the material connections.

In yet another embodiment according to the present invention, the direct placement of the lowermost memory chip of the face-down stack arrangement on a structured printed circuit board substrate, which serves as the carrier substrate, by means of BoC technology eliminates the need for the lower encapsulation and thus leads to an additional reduction of the height and the signal transit time.

To protect the stack arrangement and the electrical contacts against environmental influences that can lead to the breakdown of the component and to electrically insulate the stack arrangement and ensure easier handling, the subject matter of the present invention can be surrounded by a packaging element. This packaging element may be present especially in the form of a casting material which, depending on the epoxy resin system used, is applied at room temperature or at a defined processing temperature and which has a satisfactory mechanical and chemical stability.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a stacked memory module. The invention may also be applied, however, to other electronic components including other semiconductor devices such as processors and logic devices.

Figure 1:
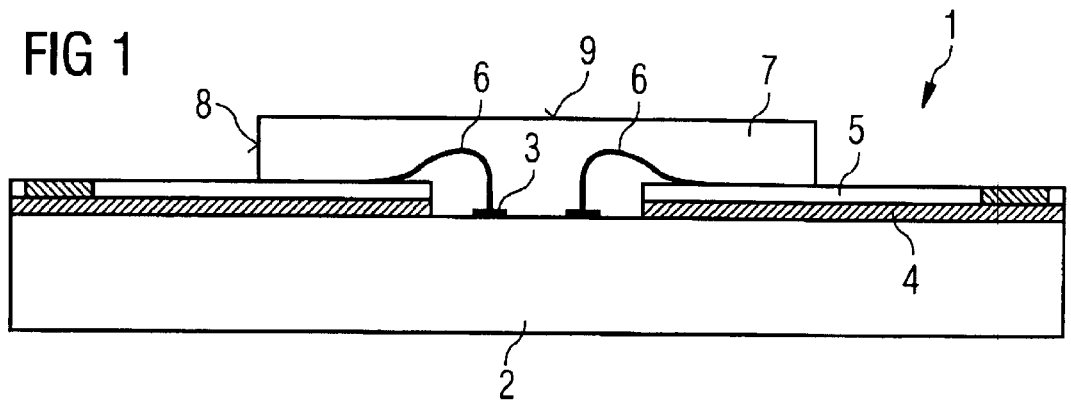
FIG. 1 shows a cross-sectional representation of a discrete component.
Figure 2:
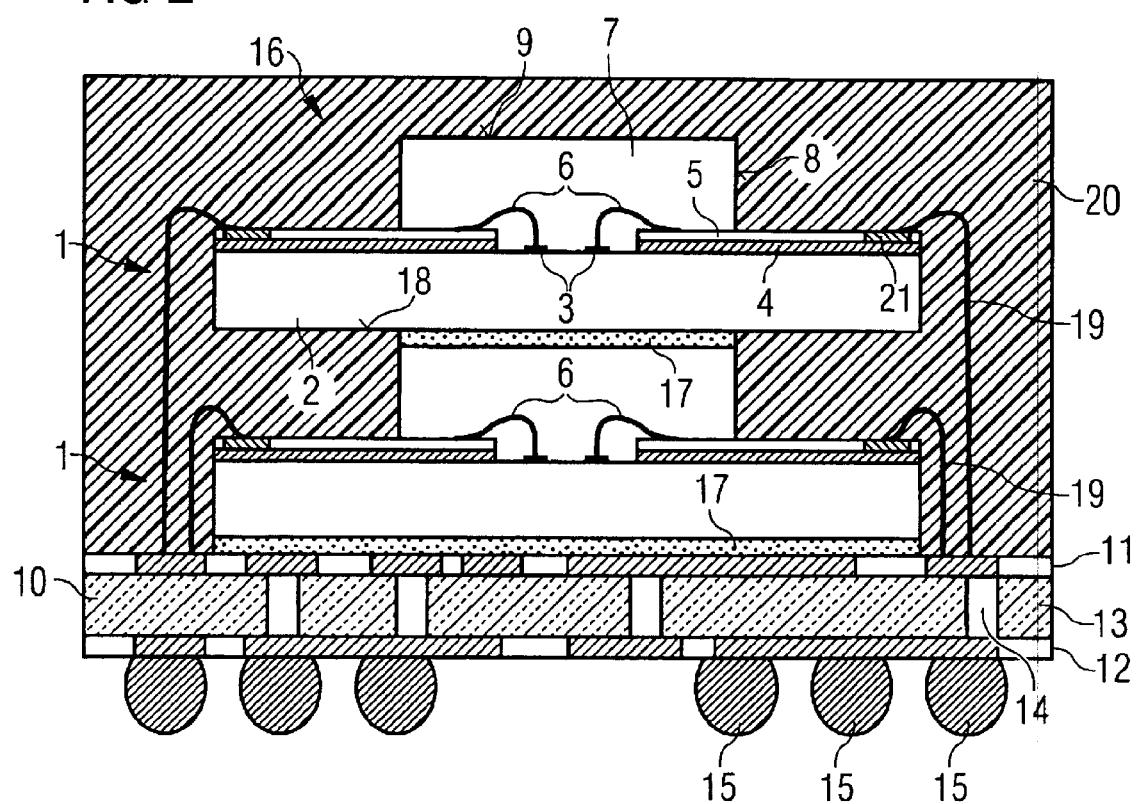
FIG. 2 shows the cross-sectional representation of the face-up stack arrangement with two discrete components and a packaging element.
Figure 3:
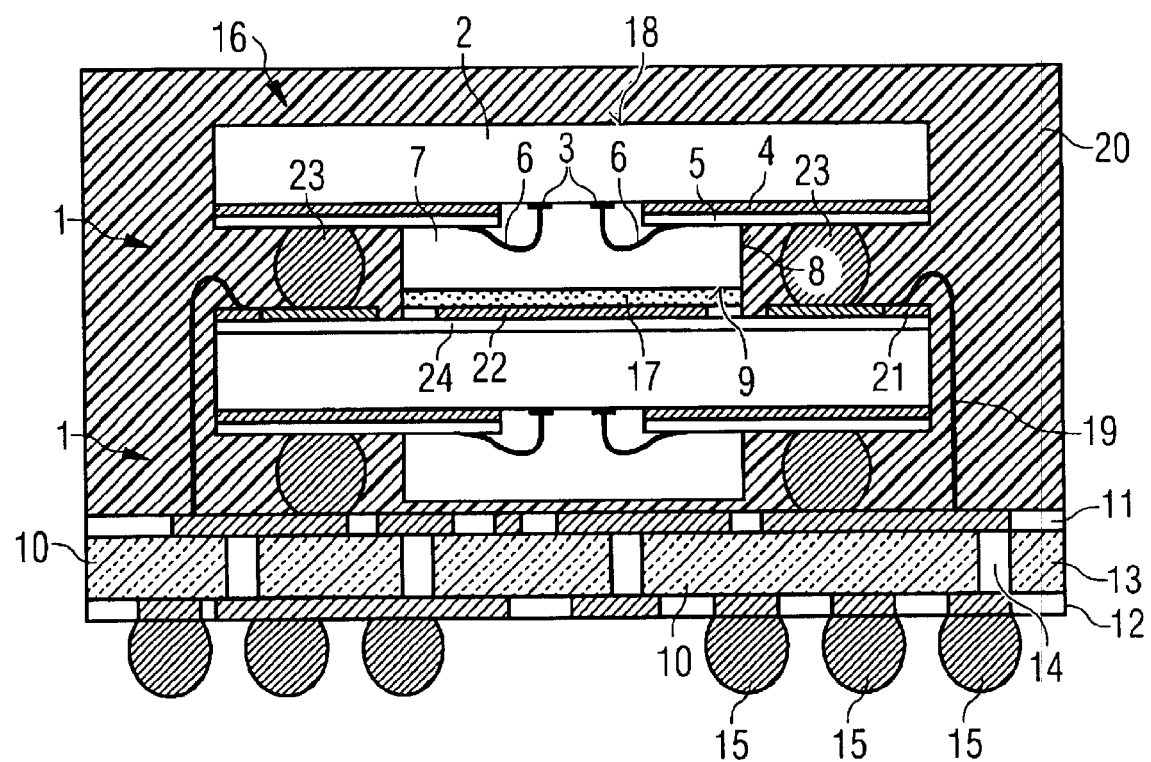
FIG. 3 shows the cross-sectional representation of the face-down stack arrangement with two discrete components and a packaging element.

FIG. 1 shows discrete component 1, which is used to construct a stack arrangement according to embodiments of the present invention, two of which are shown in FIGS. 2 and 3. Discrete component 1 comprises a semiconductor (e.g., memory) chip 2 with double-row central bond pads 3, a metallic coating 4 including an interposer 5 with line conductor structures which are electrically connected to bond pads 3 by means of wire bond connections 6. The central region of the memory chip 2 and the wire bond connections 6 are encapsulated by means of encapsulation 7. Encapsulation 7 is primarily a multi-component casting material of an epoxy resin system, which casting material is solid at room temperature and which, because of its mechanical, chemical and thermal stability and the electrical insulation, serves to affix and insulate the wire bond connections 6 and to protect them against mechanical damage during the testing and subsequent processing procedure. Encapsulation 7 has properties that protect the wire bond connections 6. Encapsulation 7 has an elevated structure 8 and a level upper enclosure 9.

FIG. 2 shows two discrete components 1 in a face-up arrangement 16 on a carrier substrate 10 consisting of a 3-layered substrate with an upper 11 and a lower 12 copper plane and a laminate 13 in between as well as passages 14 through which the line conductor structures of the upper copper plane 11 are electrically connected to the lower copper plane 12 and thus indirectly to the electrical contacts located on the lower surface of carrier substrate 10. These contacts are fine pitch ball grid arrays (FBGA) 15 by means of which the memory module is integrated into a circuit. The inactive surface area 18 of the lower discrete component 1 of the stack arrangement is affixed to carrier substrate 10 by means of a suitable adhesive 17. The inactive surface area 18 of the upper discrete component 1, on the other hand, is affixed to the upper enclosure 9 of encapsulation 7 by means of a suitable adhesive 17, which may be the same or different than the adhesive used for the lower component 1. Contact pads 21, which are located in the edge regions of the metallic coatings 4 of both discrete components 1, have wire jumpers 19 which electrically connect each discrete component 1 to the line conductor structure of the upper copper plane 11 of carrier substrate 10. The entire memory module is surrounded by a packaging element 20.

The stack arrangement 16 shown in FIG. 3 is composed of two discrete components 1 which are stacked face down on a carrier substrate 10 like the one described in FIG. 2. The lower discrete component 1 has contact with and is affixed to the line conductor structure, comprising contact pads 21 of the upper copper plane 11 by means of soldered connections 23 having the form of solder beads which, in the bonded state, provide for a defined space between carrier substrate 10 and discrete component 1, using a suitable technique for producing wavelike elevations. Disposed on the inactive surface area 18 of the lower discrete component 1 is an intermediate layer 24, which comprises a reroute layer 22 consisting of a structured metallic coating. Reroute layer 22 comprises contact pads 21, the arrangement of which corresponds to that on carrier substrate 10. Thus, the contacts of the upper discrete component 1 on reroute layer 22 correspond to the contacts of the lower carrier substrate 10. The upper discrete component 1, however, is affixed by means of a suitable adhesive 17 which, in this particular practical example, completely fills the space between encapsulation 7 of the upper discrete component 1 and reroute layer 22. Reroute layer 22, and thus indirectly the upper discrete component 1, is electrically connected via wire jumpers 19, which make contact with contact pads 21 that are located in the edge region, to the line conductor structure of the upper copper plane 11 of carrier substrate 10. Again, this stack arrangement is also surrounded by a packaging element 20 and is integrated into a circuit by means of FBGA 15.

While each of FIGS. 2 and 3 illustrate embodiments in which two components 1 are stacked, it is understood that the inventive concepts would also apply to arrangements that include three or more components 1. In the preferred embodiment, the components 1 are memory chips. In other embodiments, however, other electronic components can be used.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A stack arrangement of discrete components comprising:
   a carrier substrate having line conductor structures and contact pads; and
   at least two discrete components arranged in a stacked alignment on the carrier substrate, each of the discrete components comprising:
      centrally disposed bond pads;
      a metallic coating which is electrically connected to the centrally disposed bond pads, the metallic coating disposed on an active surface area of each discrete component; and
      a protective structure that overlies a central region of the discrete component;
   wherein the metallic coatings of each discrete component are identical;
   wherein the discrete components are stacked on the carrier substrate so as to have the same orientation, with the protective structure serving as a spacer between the discrete components; and
   wherein each metallic coating is electrically coupled to the carrier substrate.

2. The stack arrangement of discrete components as in claim 1 wherein at least an upper one of the discrete components is electrically coupled to the carrier substrate by means of wire jumpers.

3. The stack arrangement of discrete components as in claim 1, wherein the at least two discrete components are stacked face down on the carrier substrate.

4. The stack arrangement of discrete components as in claim 3 wherein the at least two discrete components include a lower discrete component and an upper discrete component, wherein the metallic coating of the upper discrete component is electrically connected to a reroute layer between the upper discrete component and the lower discrete component via soldered connections and to the carrier substrate via wire jumpers.

5. The stack arrangement of discrete components as in claim 4 wherein the lower discrete component is electrically connected to the carrier substrate via soldered connections directly to the contact pad of the carrier substrate.

6. The stack arrangement of discrete components as in claim 4 wherein the reroute layer is disposed on the back surface of the lower discrete component.

7. The stack arrangement of discrete components as in claim 6 wherein the reroute layer comprises a structured metallic layer disposed directly on a dielectric on an inactive surface of the lower discrete component.

8. The stack arrangement of discrete components as in claim 4 wherein the reroute layer is disposed on an intermediate layer.

9. The stack arrangement of discrete components as in claim 4 wherein the lower discrete component is disposed on the carrier substrate in such a way that a space is created between the protective structure of the lower discrete component and the carrier substrate.

10. The stack arrangement of discrete components as in claim 4 wherein the carrier substrate comprises a structured printed circuit board substrate and wherein the lower discrete component is disposed directly on the carrier substrate by means of board on chip technology.

11. The stack arrangement of discrete components as in claim 1 wherein the protective structure comprises an encapsulation that constitutes the mechanical fixation of the discrete component that is next in sequence.

12. The stack arrangement of discrete components as in claim 1 and further comprising a packaging element overlying the at least two discrete components.

13. The stack arrangement of discrete components as in claim 12 wherein the packaging element comprises a casting material.

14. The stack arrangement of discrete components as in claim 1 wherein the carrier substrate includes a fine pitch ball grid array (FBGA).

15. The stack arrangement of discrete components as in claim 1 wherein the discrete components comprise semiconductor chips.

16. The stack arrangement of discrete components as in claim 15 wherein the discrete components comprise memory chips.

17. A memory module comprising:
a carrier substrate including a plurality of contact pads disposed on a first surface thereof and a plurality of external contacts disposed on an opposite surface, the external contacts being electrically coupled to the contact pads;
a first memory chip including an active surface and an inactive surface, the inactive surface being adhered to the first surface of the carrier substrate, the first memory chip including bond pads adjacent the active surface, the bond pads being wire bonded to contact pads of the carrier substrate;
a spacer material disposed on the active surface of the first memory chip; and
a second memory chip including an active surface and an inactive surface, the inactive surface being adhered to the spacer material, the second memory chip including bond pads adjacent the active surface, the bond pads being wire bonded to contact pads of the carrier substrate.

18. The module of claim 17 wherein each memory chip comprises centrally disposed pads that are electrically coupled to the bond pads through a metallic coating, the metallic coating being disposed on the active surface of the memory chip.

19. The module of claim 17 wherein the external contacts of the carrier substrate are arranged in a fine pitch ball grid array (FBGA).

20. The module of claim 17 wherein the spacer material comprises an encapsulation material formed over the active surface of the first memory chip.

21. The module of claim 20 and further comprising an encapsulation material formed over the active surface of the second memory chip.

22. A memory module comprising:
a carrier substrate including a plurality of contact pads disposed on a first surface thereof and a plurality of external contacts disposed on an opposite surface, the external contacts being electrically coupled to the contact pads;
a first spacer adhered to the first surface of the carrier substrate;
a first memory chip including an active surface and an inactive surface, the active surface being adhered to the first spacer, the first memory chip including contact pads adjacent the active surface, the contact pads being electrically coupled to contact pads of the carrier substrate;
a second spacer disposed over the inactive surface of the first memory chip;
a reroute layer adjacent the inactive surface of the first memory chip, the reroute layer being electrically coupled to contact pads of the carrier substrate; and
a second memory chip including an active surface and an inactive surface, the active surface being adhered to the second spacer, the second memory chip including contact pads adjacent the active surface, the contact pads being electrically coupled to the reroute layer.

23. The module of claim 22 wherein the contact pads of the first memory chip are soldered to the contact pads of the carrier substrate.

24. The module of claim 23 wherein the first memory chip comprises centrally disposed pads that are electrically coupled to the contact pads through a metallic coating, the metallic coating being disposed on the active surface of the memory chip.

25. The module of claim 24 wherein the centrally disposed pads are electrically coupled to the metallic coating by wire bonds.

26. The module of claim 25 wherein the first spacer comprises a material that encapsulates the wire bonds.

27. The module of claim 26 wherein the second memory chip comprises centrally disposed pads that are electrically coupled to the contact pads through a metallic coating, the metallic coating being disposed on the active surface of the memory chip, wherein the centrally disposed pads are electrically coupled to the metallic coating by wire bonds, and wherein the second spacer comprises a material that encapsulates the wire bonds.

28. The module of claim 22 wherein the reroute layer comprises a conductor that is deposited on the inactive surface of the first memory chip.

29. The module of claim 28 wherein the contact pads of the second memory chip are soldered to the reroute layer.

30. The module of claim 22 wherein the first memory chip further comprises a dielectric layer formed on the inactive surface, wherein the reroute layer comprises a structured metallic layer disposed directly on the dielectric layer on the inactive surface.

31. The module of claim 22 wherein the contact pads of the second memory chip are soldered to the reroute layer.

32. The module of claim 22 and further comprising an intermediate layer disposed between the first memory chip and the second memory chip, wherein the reroute layer is disposed on the intermediate layer.

33. The module of claim 22 wherein the reroute layer is disposed between the first memory chip and the second spacer.

* * * * *